United States Patent
Hsu et al.

(10) Patent No.: US 9,305,853 B2
(45) Date of Patent: Apr. 5, 2016

(54) ULTRA FINE PITCH POP CORELESS PACKAGE

(71) Applicant: Apple Inc., Cupertino, CA (US)

(72) Inventors: Jun Chung Hsu, Cupertino, CA (US); Jun Zhai, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/088,736

(22) Filed: Nov. 25, 2013

(65) Prior Publication Data

US 2015/0061142 A1 Mar. 5, 2015

Related U.S. Application Data

(60) Provisional application No. 61/872,193, filed on Aug. 30, 2013.

(51) Int. Cl.
*H01L 23/52* (2006.01)
*H01L 29/40* (2006.01)
(Continued)

(52) U.S. Cl.
CPC ............ *H01L 23/12* (2013.01); *H01L 21/4857* (2013.01); *H01L 21/76802* (2013.01); *H01L 23/13* (2013.01); *H01L 23/481* (2013.01); *H01L 23/49822* (2013.01); *H01L 25/0657* (2013.01); *H01L 25/105* (2013.01); *H01L 25/50* (2013.01);
(Continued)

(58) Field of Classification Search
CPC ... H01L 23/12; H01L 25/105; H01L 21/4857; H01L 23/481; H01L 21/76802; H01L 23/49822; H01L 23/13; H01L 25/0657; H01L 25/50; H01L 2225/1023; H01L 2924/1533; H01L 2225/1058; H01L 2225/06517; H01L 2225/06513; H01L 2924/153
See application file for complete search history.

(56) References Cited

U.S. PATENT DOCUMENTS

2005/0088833 A1  4/2005  Kikuchi et al.
2006/0051895 A1  3/2006  Abe et al.
(Continued)

FOREIGN PATENT DOCUMENTS

EP      2164311      3/2010
WO    2013025205    2/2013

OTHER PUBLICATIONS

Electronic Components and Technology Conference "Warpage and Electrical Performance of Embedded Device Package, MCep" Kouichi Tanaka, et al., 2011, pp. 1377-1383.
(Continued)

*Primary Examiner* — Jarrett Stark
(74) *Attorney, Agent, or Firm* — Meyertons, Hood, Kivlin, Kowert & Goetzel, P.C.; Gareth M Sampson; Lawrence J. Merkel (57) ABSTRACT

A bottom package for a PoP (package-on-package) may be formed with a reinforcement layer supporting a thin or coreless substrate. The reinforcement layer may provide stiffness and rigidity to the substrate to increase the stiffness and rigidity of the bottom package and provide better handling of the substrate. The reinforcement layer may be formed using core material, a laminate layer, and a metal layer. The substrate may be formed on the reinforcement layer. The reinforcement layer may include an opening sized to accommodate a die. The die may be coupled to an exposed surface of the substrate in the opening. Metal filled vias through the reinforcement layer may be used to couple the substrate to a top package.

20 Claims, 11 Drawing Sheets

(51) Int. Cl.
   *H01L 23/28* (2006.01)
   *H01L 23/12* (2006.01)
   *H01L 21/768* (2006.01)
   *H01L 23/48* (2006.01)
   *H01L 25/065* (2006.01)
   *H01L 25/00* (2006.01)
   *H01L 23/13* (2006.01)
   *H01L 23/498* (2006.01)
   *H01L 21/48* (2006.01)
   *H01L 25/10* (2006.01)

(52) U.S. Cl.
   CPC ............ *H01L 2224/16225* (2013.01); *H01L 2224/32225* (2013.01); *H01L 2224/73204* (2013.01); *H01L 2225/06513* (2013.01); *H01L 2225/06517* (2013.01); *H01L 2225/1023* (2013.01); *H01L 2225/1058* (2013.01); *H01L 2924/1533* (2013.01); *H01L 2924/15153* (2013.01); *H01L 2924/15311* (2013.01); *H01L 2924/19106* (2013.01)

(56) References Cited

U.S. PATENT DOCUMENTS

| | | |
|---|---|---|
| 2007/0289127 A1 | 12/2007 | Hurwitz et al. |
| 2008/0142964 A1* | 6/2008 | Sun et al. ............ 257/737 |
| 2010/0073894 A1 | 3/2010 | Mortensen et al. |
| 2010/0327419 A1 | 12/2010 | Muthukumar et al. |
| 2011/0037158 A1* | 2/2011 | Youn et al. ............ 257/686 |
| 2011/0140268 A1 | 6/2011 | Cheah et al. |
| 2012/0319274 A1 | 12/2012 | Tanaka et al. |

OTHER PUBLICATIONS

International Search Report and Written Opinion from PCT/US2014/050312, issued Jan. 8, 2015, Apple Inc., pp. 1-10.

* cited by examiner

ULTRA FINE PITCH POP CORELESS PACKAGE

PRIORITY

Priority Information

This application claims benefit of priority of U.S. Provisional Application Ser. No. 61/872,193 entitled "ULTRA FINE PITCH PoP CORELESS PACKAGE" filed Aug. 30, 2013, the content of which is incorporated by reference herein in its entirety.

BACKGROUND

1. Field of the Invention

The present invention relates to semiconductor packaging and methods for packaging semiconductor devices. More particularly, the invention relates to a bottom package of a PoP (package-on-package) that accommodates an active or passive component.

2. Description of Related Art

Package-on-package ("PoP") technology has become increasingly popular as the demand for lower cost, higher performance, increased integrated circuit density, and increased package density continues in the semiconductor industry. As the push for smaller and smaller packages increases, the integration of die and package (e.g., "pre-stacking" or the integration of system on a chip ("SoC") technology with memory technology) allows for thinner packages. Such pre-stacking has become a critical component for thin and fine pitch PoP packages.

One limitation in reducing the size of a package (e.g., either the top package (the memory package) or the bottom package (the SoC package) in the PoP package) is the size of the substrate used in the package. Thin substrates and/or coreless substrates (e.g., laminate substrates) have been used to reduce the thickness of the packages to more desirable levels. The likelihood of warping, caused by the difference in thermal characteristics of materials, may increase, however, due to the use of thinner substrates in the package. Warping likelihood may increase because the thin or coreless substrates have less mechanical strength to resist the effects caused by differences in thermal characteristics between materials.

Thus, as PoP packages get thinner and pitch (e.g, spacing between contacts) gets finer, warping has an increased role in failure or reduced performance of the PoP package and/or problems in reliability of devices utilizing the PoP package. For example, the differences in warpage behavior between top and bottom packages in the PoP package may cause yield loss in the solder joints coupling the packages (e.g., either shorts or bridges between adjacent solder joints or open or disconnected opposing solder terminals depending on the warpage behavior). A large fraction of PoP structures may be thrown away (rejected) because of stringent warpage specifications placed on the top and/or bottom packages. Rejecting PoP structures contributes to low pre-stack yield, wasted materials, and increased manufacturing costs. Thus, many advancements and/or design modifications are being taken and contemplated to inhibit warping in packages using thin or coreless substrates and packages with fine ball pitches.

One solution that has been used for fine ball pitches has been the use of an encapsulant or molding material on the top surface of the bottom package. The encapsulant may be used to inhibit shorting between solder joints during solder reflow. The encapsulant may also provide electrical insulation between adjacent solder joints during use of the PoP package and/or provide mechanical support for the die (e.g., SOC) coupled to the bottom substrate. Through-mold vias (TMVs) are typically used to provide terminals on the bottom package to connect to terminals (e.g., solder balls) on the top package. One problem that arises with the use of TMVs is that during formation of the vias (typically done with laser ablation), the vias may be overablated. Overablation may create thin walls in the encapsulant between adjacent TMVs. These thin walls may allow solder to flow between adjacent TMVs during solder reflow and bridge (short) the corresponding adjacent solder joints. The use of TMVs may also lead to open defects in the PoP package. Open defects may be caused by shifting of the top package and/or bottom package, poor control of the TMV shape, and/or sticking of solder balls due to ball size. As PoP ball pitch gets smaller, problems caused by bridging or open defects may become more frequent and/or more severe.

SUMMARY

In certain embodiments, a PoP package includes a bottom package and a top package. The bottom package may include a die coupled to a substrate. The substrate may be a thin or coreless substrate. A reinforcement layer may be coupled to an upper surface of the substrate and at least partially cover the substrate. The die may be coupled to the substrate in an opening in the reinforcement layer. At least part of the substrate may be exposed in the opening. In certain embodiments, at least some conductive (metal) traces or pads in the substrate are exposed in the opening and the die is coupled to at least some of the conductive traces or pads.

The reinforcement layer may include one or more terminals coupled to the substrate. The terminals may be vias through the reinforcement layer that are at least partially filled with metal. The terminals may be exposed at a top surface of the reinforcement layer. The terminals may be used to couple the bottom package to the top package by coupling to one or more terminals on the top package. The top package may include a memory die. In some embodiments, the top package is a printed circuit board (PCB) and a memory die is coupled to the other (non-PCB) side of the bottom package.

In certain embodiments, the reinforcement layer includes core material, a laminate layer, and a metal layer (e.g., metal at least partially filling vias through the core material). The laminate layer may include build-up film or prepreg material. In some embodiments, a height of the reinforcement layer above the substrate is substantially similar to a height of the die above the substrate.

BRIEF DESCRIPTION OF THE DRAWINGS

Features and advantages of the methods and apparatus of the present invention will be more fully appreciated by reference to the following detailed description of presently preferred but nonetheless illustrative embodiments in accordance with the present invention when taken in conjunction with the accompanying drawings in which.

While the invention is susceptible to various modifications and alternative forms, specific embodiments thereof are shown by way of example in the drawings and will herein be described in detail. The drawings may not be to scale. It should be understood that the drawings and detailed description thereto are not intended to limit the invention to the particular form disclosed, but to the contrary, the intention is to cover all modifications, equivalents and alternatives falling within the spirit and scope of the present invention as defined by the appended claims.

DETAILED DESCRIPTION OF EMBODIMENTS

Figure 1A:
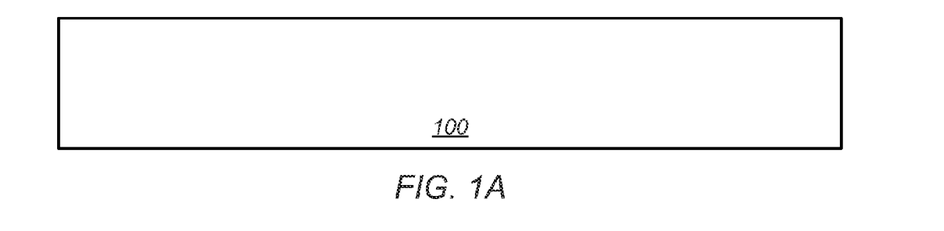
FIGS. 1A-K depict cross-sectional representations of an embodiment of a process flow for forming a bottom package of a PoP package.

FIGS. 1A-K depict cross-sectional representations of an embodiment of a process flow for forming a bottom package of a PoP package. FIG. 1A depicts a cross-sectional representation of an embodiment of carrier 100. Carrier 100 may be any carrier suitable for supporting and carrying a coreless substrate or similar thin substrate. Carrier 100 may be, for example, a temporary substrate for a coreless substrate or other thin substrate.

Figure 1B:
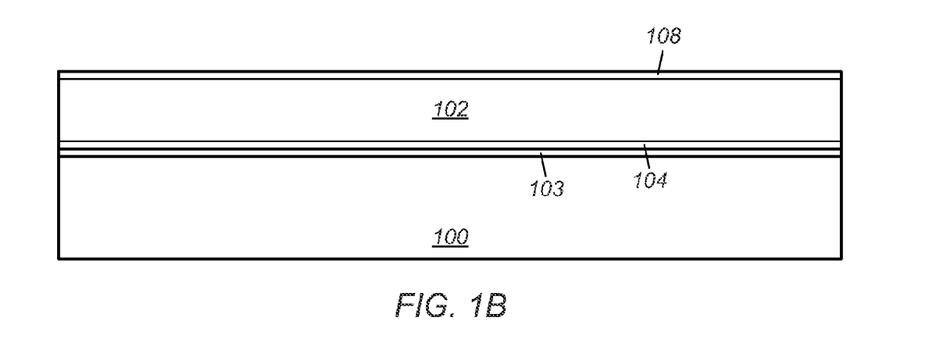

FIG. 1B depicts a cross-sectional representation of an embodiment of core material 102 coupled to carrier 100. Core material 102 may be any suitable material known in the art for use as a core material in integrated circuit packages. For example, core material 102 may be a dielectric material such as, but not limited to, a ceramic or resin material.

Core material 102 may be coupled to carrier 100 by, for example, bonding or laminating the core material to the carrier. In certain embodiments, core material 102 is coupled to carrier 100 using laminate layer 104. In some embodiments, seed layer 103 is used between carrier 100 and laminate layer 104. Seed layer 103 may be, for example, a copper seed layer. In certain embodiments, laminate layer 104 includes laminate materials such as, but not limited to, ABF (Ajinomoto Build-Up Film) laminate materials or prepreg (pre-impregnated) laminate materials. ABF laminate may be applied, for example, using vacuum lamination. Prepreg laminate may be applied, for example, using hot press lamination. In some embodiments, metal layer 108 is formed on core material 102. Metal layer 108 may be copper or another suitable conductive metal.

Figure 1C:
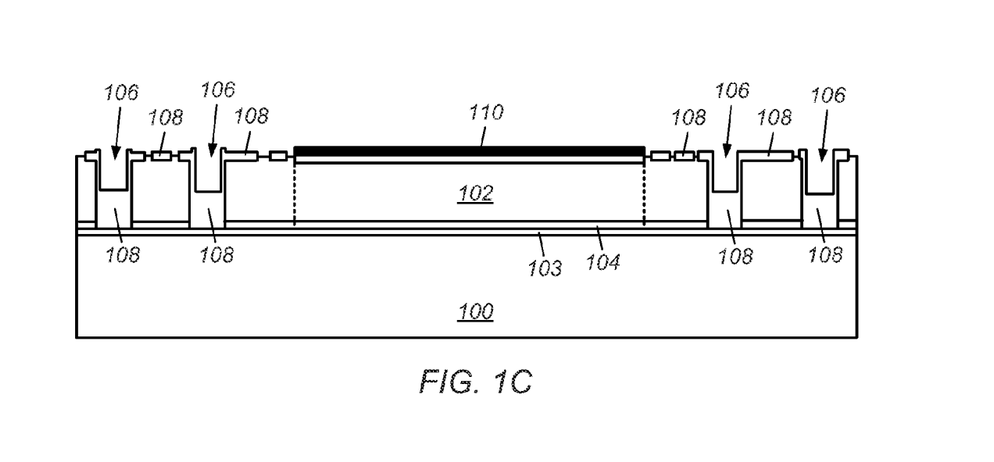

In certain embodiments, after coupling core material 102 to carrier 100, vias 106 (e.g., through holes) are formed in the core material and at least partially filled with metal layer 108, as shown in FIG. 1C. Vias 106 may be formed, for example, by laser drilling in core material 102. After vias 106 are formed, additional metal layer 108 (e.g., copper) may be deposited in the vias. In some embodiments, metal layer 108 only partially fills vias 106. In some embodiments, portions of metal layer 108 on the surface of core material 102 is patterned or otherwise defined to provide metal features on the surface of the core material.

In certain embodiments, barrier layer 110 is formed on core material 102, as shown in FIG. 1C. Barrier layer 110 may be, for example, a nickel or nickel-copper barrier layer formed by plating. Barrier layer 110 may be formed over core material 102 in an area (defined by the dotted lines in FIG. 1C) that is later used as a terminal (bump) pad area for a die coupled to the package.

Figure 1D:
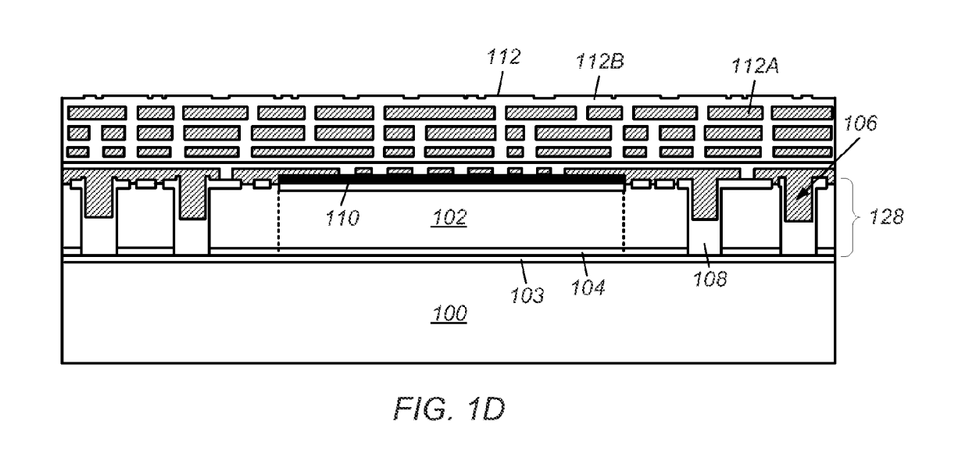

After core material 102 is patterned and vias 106 are filled with metal layer 108, bottom package substrate 112 may be formed on core material 102, as shown in FIG. 1D. In certain embodiments, substrate 112 is a coreless substrate (e.g., a substrate made of only dielectric polymer 112A and conductive (metal such as copper) traces 112B). Substrate 112 may, however, be another relatively thin substrate (e.g., a substrate less than about 400 μm in thickness). In certain embodiments, substrate 112 is a coreless substrate made of polymer substantially similar to laminate layer 104. For example, substrate 112 may include ABF or prepreg materials as the polymer surrounding the conductive traces. In certain embodiments, substrate 112 is made of one or more layers of polymer material and conductive traces.

As shown in FIG. 1D, core material 102, laminate layer 104, and metal layer 108 form reinforcement layer 128. Reinforcement layer 128 provides reinforcement for substrate 112. For example, reinforcement layer 128 may support substrate 112 and stiffen the substrate (e.g., make the substrate more rigid). Stiffening substrate 112 may allow for better handling of the substrate and provide more stiffness to a bottom package made using the substrate.

Figure 1E:
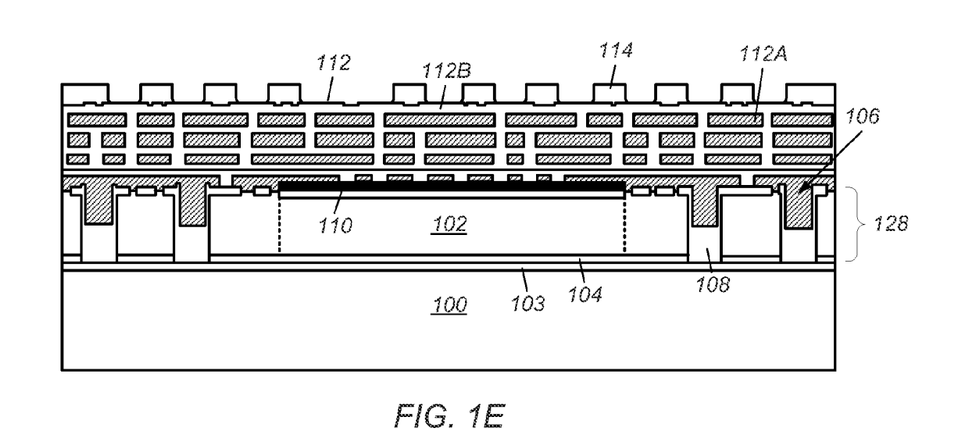
Figure 1F:
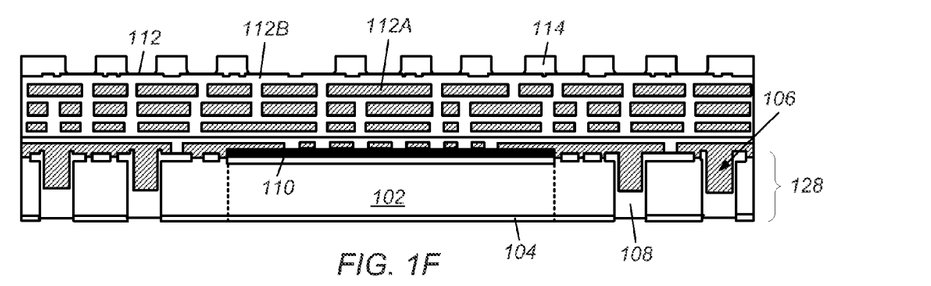

Following formation of substrate 112, mask 114 may be formed on the substrate, as shown in FIG. 1E. Mask 114 may define locations for terminals (e.g., bump pads or solder balls) on the surface of substrate 112. Mask 114 may be, for example, a solder mask or another material defined using laser ablation. Following formation of mask 114, carrier 100 may be removed from the bottom surface of core material 102 and laminate layer 104, as shown in FIG. 1F. In embodiments with seed layer 103 between laminate layer 104 and carrier 100, the seed layer may also be removed. In certain embodiments, portions of laminate layer 104 are removed to expose metal layer 108 in vias 106. The presence of reinforcement layer 128 provides rigidity and stiffness for better handling of substrate 112 in the absence of carrier 100.

Figure 1G:
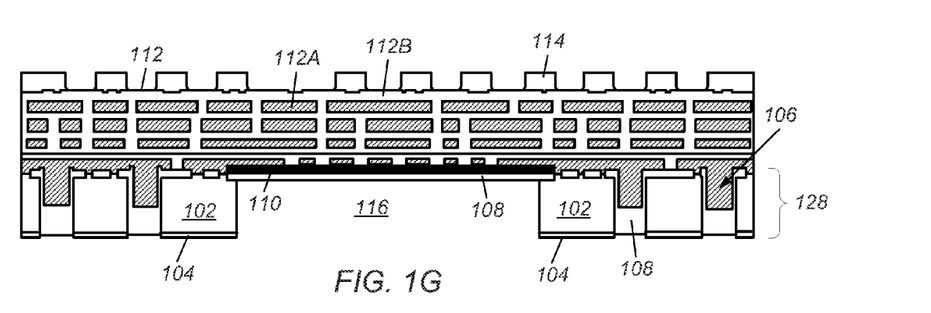

After carrier 100 is removed, a cavity or opening may be formed to allow connection of a die to substrate 112 through core material 102 (e.g., the cavity or opening is formed to provide a terminal (bump) pad area for a die coupled to the package). FIGS. 1G-1J depict an embodiment of a process for forming the cavity or opening providing the terminal pad area for the die. As shown in FIG. 1G, core material 102 may be removed to form opening 116. Opening 116 may be formed in the area defined by the dotted lines depicted in FIGS. 1C-F. Core material 102 may be removed, for example, by laser ablation of the core material. In certain embodiments, the core material removal process (e.g., the laser ablation process) is stopped by the presence of metal layer 108.

Figure 1H:
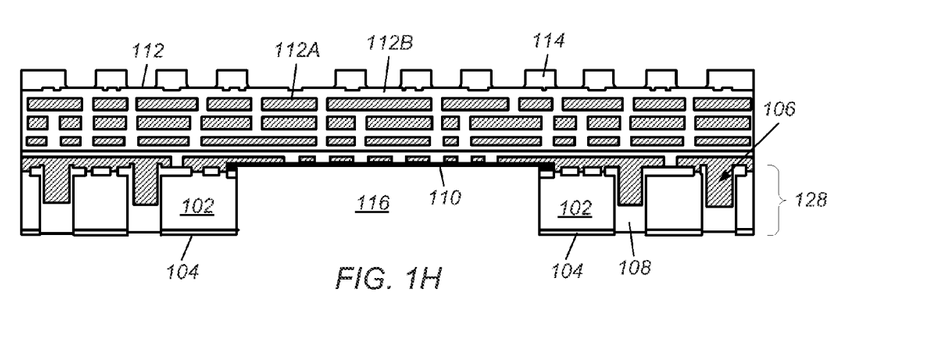

After the core material removal process, metal layer 108 (e.g., the copper layer) may be removed (e.g., etched), as shown in FIG. 1H. Barrier layer 110 may be used as an etch stop layer for the metal layer removal process (e.g., the barrier layer is made of another material that is resistant to the etch process used to remove metal layer 108). The presence of barrier layer 110 may inhibit overetching of substrate 112 during the metal layer removal process.

Figure 1I:
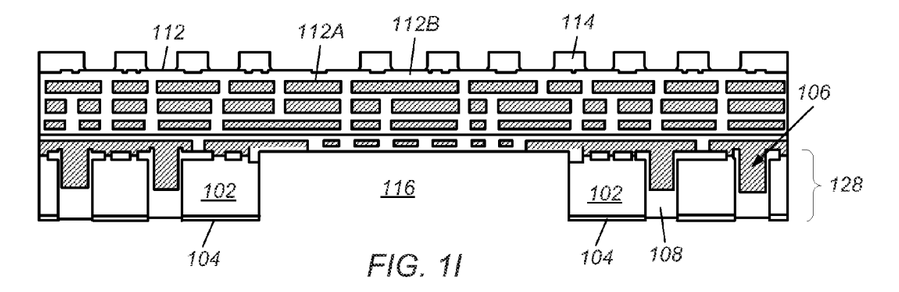
Figure 1J:
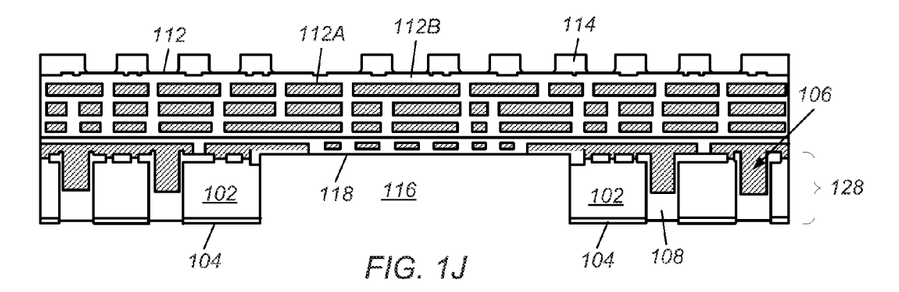

After metal layer 108 is removed, barrier layer 110 may be removed using a different removal process (e.g., a different etch process), as shown in FIG. 1I. Removal of barrier layer 110 exposes the surface of substrate 112 in opening 116. After removing barrier layer 110, one or more surface finishes may be applied to the surface of substrate 112 in opening 116, as shown in FIG. 1J. Examples of surface finishes that may be used include, but are not limited to, OSP (organic solder preservative), ENEPIG (electroless nickel/electroless palladium/immersion gold), or SOP (solder on pad) for PoP. Finishing the surface of substrate 112 forms terminal (bump) pad 118 for coupling of a die to the substrate surface in opening 116.

Because opening 116 is formed using a process that removes material down to the surface of substrate 112 to expose the surface, the terminal (bump) pad pattern on the substrate is defined by the metal (conductive) traces at the surface of the substrate. Defining the terminal pad pattern using the metal traces allows for finer pitch in the terminal pad pattern than if the pattern is defined using a build-up process to form pads on the surface of the substrate. Additionally, using laser ablation (or a similar technique) to remove core material 102 and form opening 116 allows the terminal pad area (e.g., the width of the opening) to be as small as desired. For example, opening 116 may have a width slightly larger than a width of the die placed in the opening.

Figure 1K:
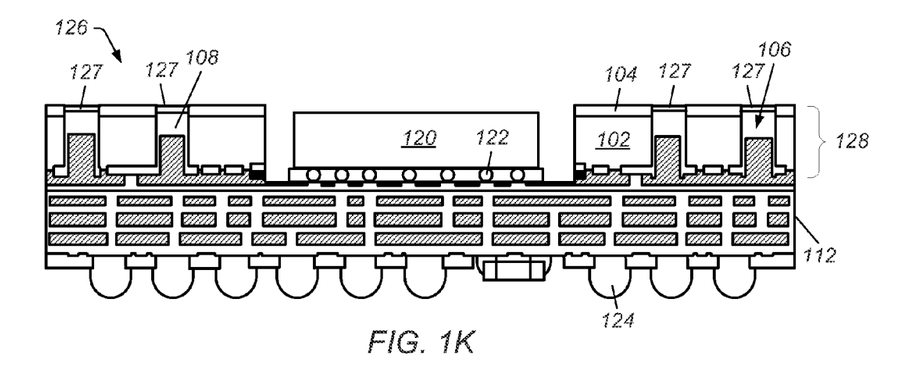

After terminal pad 118 is formed in opening 116, die 120 may be coupled to substrate 112 in the opening, as shown in FIG. 1K. Die 120 may be, for example, a semiconductor chip, an integrated circuit die, a passive component, or a flip chip die. In certain embodiments, die 120 is a system on a chip ("SoC"). Die 120 may be coupled to substrate terminal pad 118 using one or more terminals 122. For example, terminals 122 may be solder balls coupled to solder pads on terminal pad 118. In certain embodiments, as shown in FIG. 1K, the top of die 120 is at a substantially similar height or a lower height than the top of laminate layer 104 on top of core material 102.

In certain embodiments, terminals 124 are coupled to the bottom of substrate 112 (as defined by mask 114) and bottom package 126 is formed. Terminals 124 may be used to couple substrate 112 and package 126 to a motherboard or a system printed circuit board (PCB).

Figure 6:
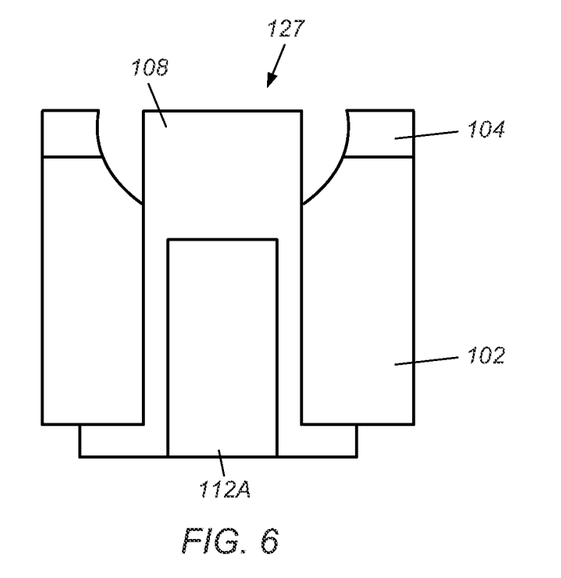
FIG. 6 depicts a cross-section representation of an embodiment of a terminal.
Figure 7:
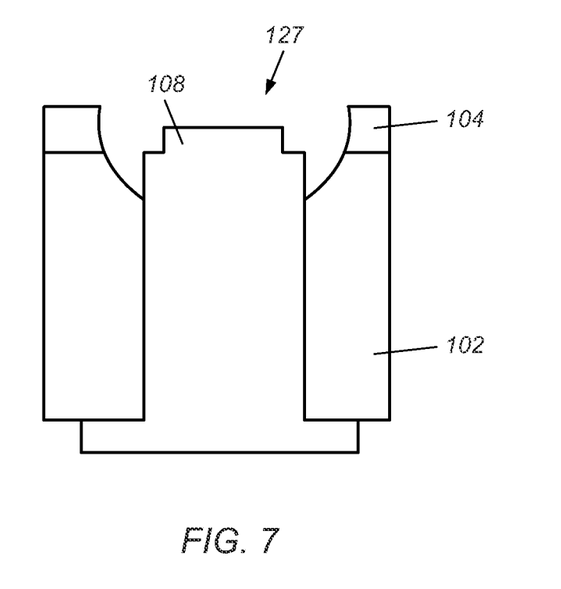
FIG. 7 depicts a cross-section representation of another embodiment of a terminal.

In certain embodiments, terminals 127 are formed on or from exposed surfaces of metal layer 108 on top of bottom package 126. Terminals 127 may be used to couple bottom package 126 to a top package in a PoP package. Terminals 127 may have any terminal shape desired (e.g., the terminals may be shaped (created) using laser etching or ablation). FIGS. 6 and 7 depict examples of embodiments of different shapes for terminals 127 that may be formed in bottom package 126. Terminals 127 may also have different surface finishes as desired (e.g., SOP, ENEPIG, EPIG (electroless palladium/immersion gold), etc.).

Figure 2A:
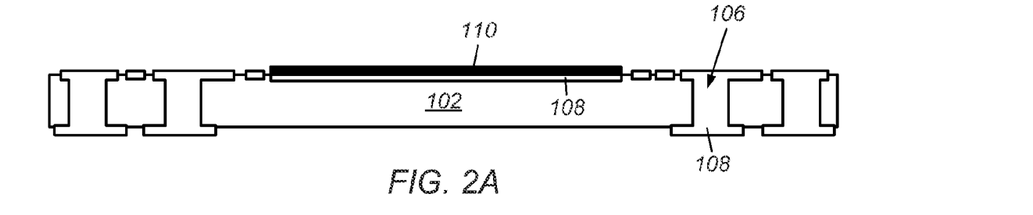
FIG. 2A-K depict cross-sectional representations of an alternative embodiment of a process flow for forming a bottom package of a PoP package.

FIGS. 2A-K depict cross-sectional representations of an alternative embodiment of a process flow for forming a bottom package of a PoP package. FIG. 2A depicts a cross-sectional representation of an embodiment of core material 102 with metal layer 108 filling vias 106 through the core material. Vias 106 may be formed, for example, by laser drilling in core material 102. Metal layer 108 may be formed, for example, by paste hole (PTH) filling of vias 106. Metal layer 108 may be copper or another suitable conductive metal. Metal layer 108 may also cover portions of the surface of core material 102. In some embodiments, portions of metal layer 108 on the surface of core material 102 is patterned or otherwise defined to provide metal features on the surface of the core material. In certain embodiments, barrier layer 110 is formed on core material 102.

Figure 2B:
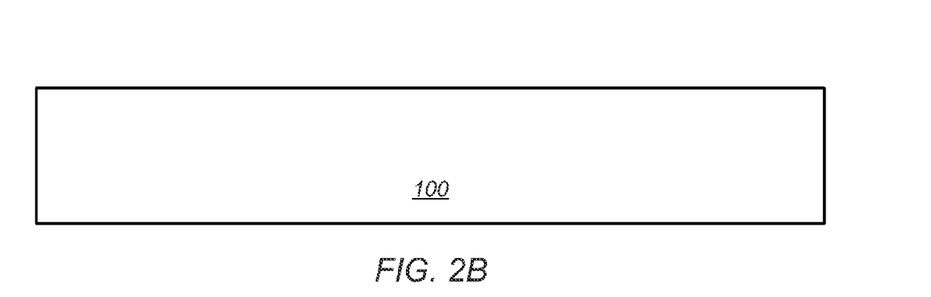
Figure 2C:
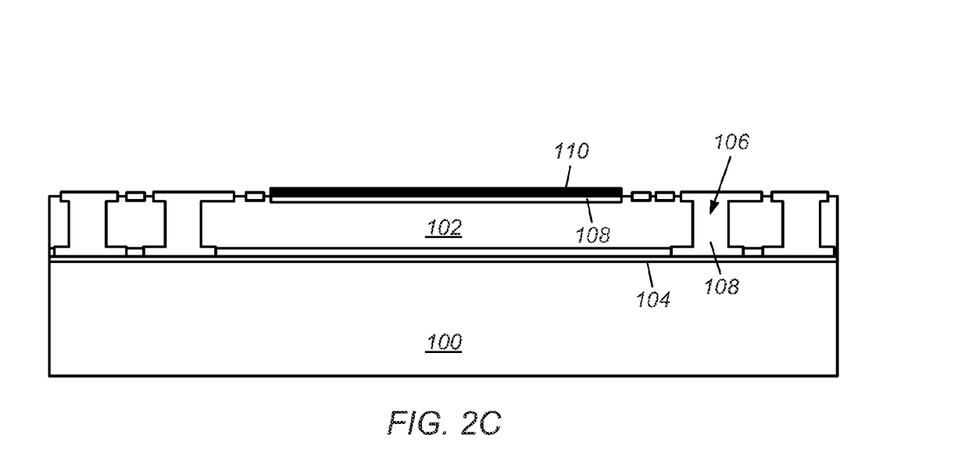

After core material 102 is patterned and metal layer 108 is formed, core material 102 may be coupled to carrier 100 (shown in FIG. 2B). FIG. 2C depicts core material 102 and carrier 100 coupled using laminate layer 104. Core material 102 may be coupled to carrier 100 by, for example, bonding or laminating the core material to the carrier using laminate layer 104. In some embodiments, a seed layer (not shown) is used between carrier 100 and laminate layer 104. In certain embodiments, laminate layer 104 includes laminate materials such as, but not limited to, ABF (Ajinomoto Build-Up Film) laminate materials or prepreg (pre-impregnated) laminate materials.

Figure 2D:
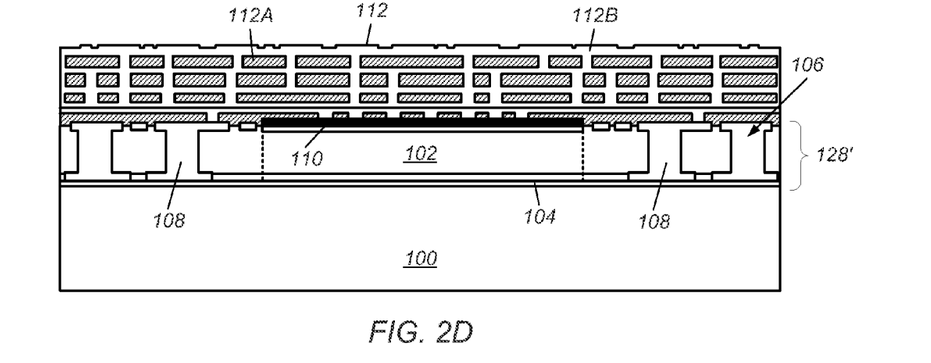
Figure 2E:
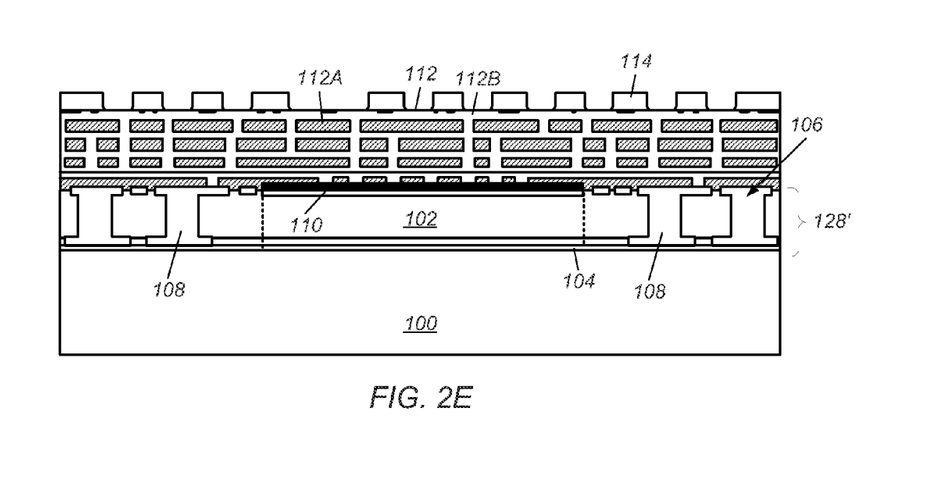
Figure 2F:
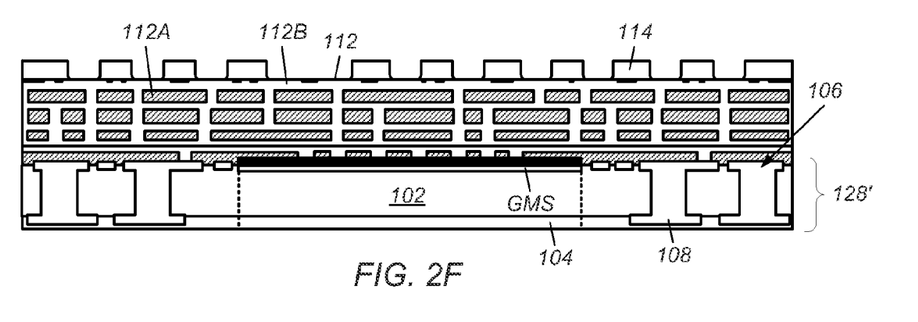
Figure 2G:
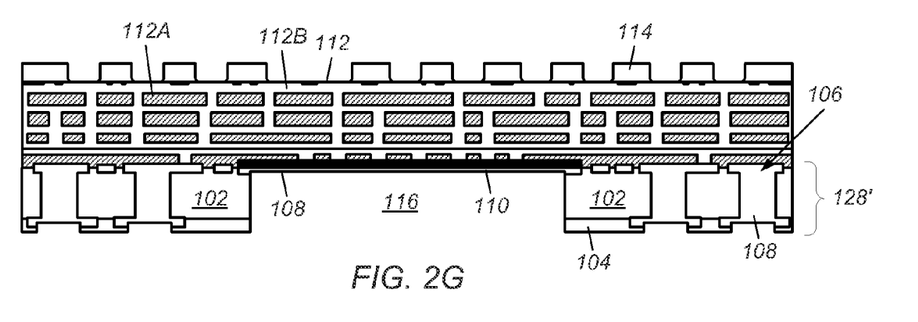
Figure 2H:
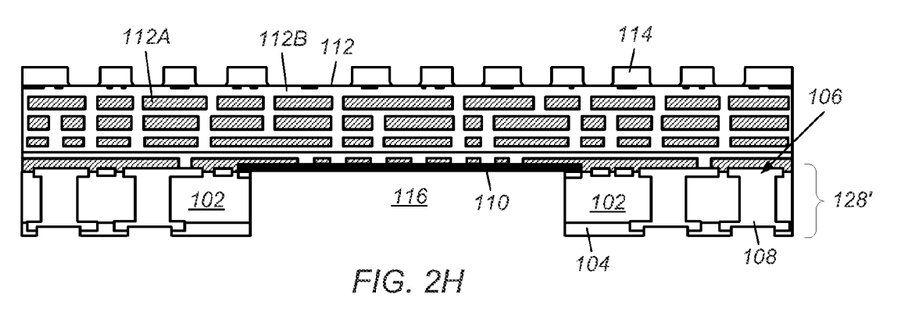
Figure 2I:
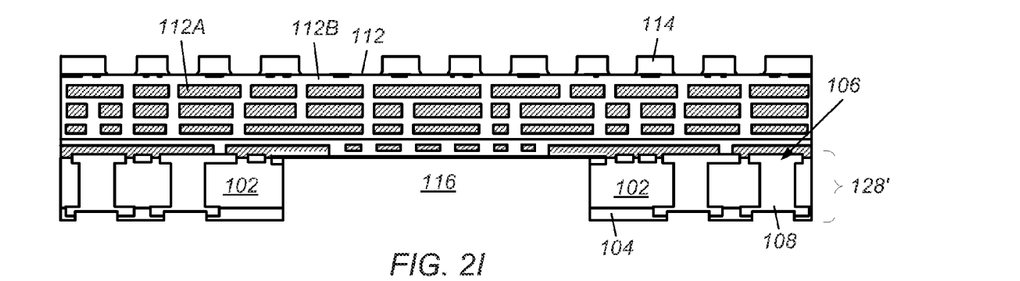
Figure 2J:
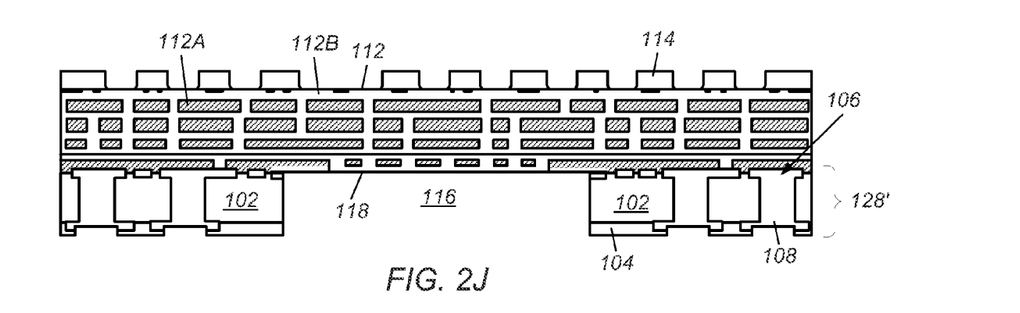

After core material 102 and carrier 100 are coupled using laminate layer 104, bottom package substrate 112 may be formed on core material 102, as shown in FIG. 2D. Core material 102, laminate layer 104, and metal layer 108 form reinforcement layer 128'. Reinforcement layer 128', shown in FIG. 2D, is substantially similar to reinforcement layer 128, shown in FIG. 1D, with a difference being the substantially complete filling of vias 106 in core material 102 with metal layer 108 (e.g., the metal layer substantially fills the vias in the core material due to the paste hole filling of the vias). Subsequent processing of carrier 100, core material 102, laminate layer 104, barrier layer 110, and substrate 112 in FIGS. 2E-2K is also substantially similar to the processing described in FIGS. 1E-1K. Thus, package 126' with reinforcement layer 128', shown in FIG. 2K, has a substantially similar structure to package 126 with reinforcement layer 128, shown in FIG. 1K.

Figure 2K:
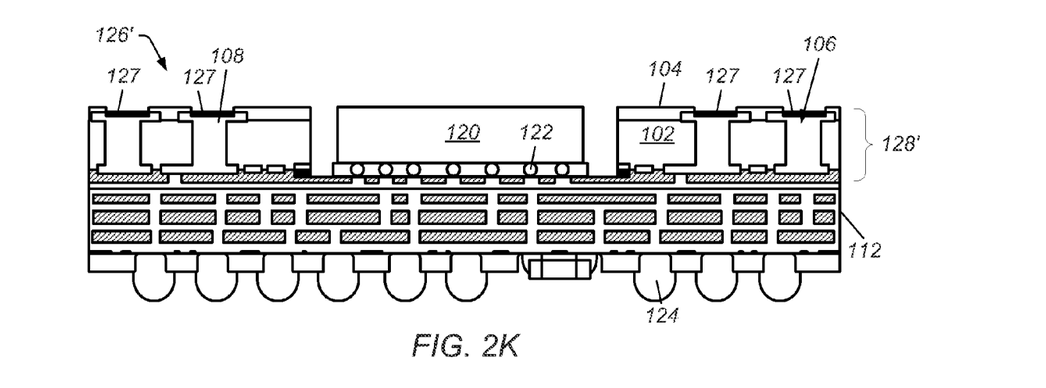

As shown in FIGS. 1K and 2K, the reinforcement layer (reinforcement layer 128 or reinforcement layer 128') provides reinforcement for substrate 112 and the bottom package (bottom package 126 or bottom package 126') with a minimal amount of added z-height (vertical height). As described above, reinforcement layer 128 (or reinforcement layer 128') may have a height substantially similar to the height of die 120. In some embodiments, the height of the reinforcement layer is adjusted to accommodate (e.g., substantially match) the height of die 120. The height of the reinforcement layer may be adjusted to a minimum thickness needed to provide certain stiffness parameters for the bottom package. In addition, the use of the reinforcement layer allows the total height of the bottom package to be reduced through the use of thin or coreless substrates that can have minimal thicknesses because of the rigidity provided by the reinforcement layer.

Typical substrate processes include the use of encapsulants or other molding materials and/or the formation of through-mold vias (TMVs)). Such substrate processes may be somewhat unreliable processes due to added complexity in incorporating encapsulant and/or TMV techniques. Because the substrate process embodiments depicted in FIGS. 1A-1K and FIGS. 2A-2K do not include the use of encapsulants or TMVs, such substrate processes may be an easier and more reliable substrate processes. Processing the substrate as depicted in FIGS. 1A-1K or FIGS. 2A-2K may also be less costly than processing using encapsulants or TMVs. Providing the reinforcement layer also, as described above, provides better handling of the substrate, which may improve substrate yield by reducing handling errors during processing.

In addition, the process embodiments depicted in FIGS. 1A-1K and FIGS. 2A-2K process the substrate (substrate 112) before coupling the substrate to a die (die 120). Typically, substrate processing occurs with the die already coupled to (e.g., embedded on) the substrate. After such substrate processes, if the substrate fails then the coupled die is discarded (thrown away) along with the substrate. Substrate yields (and thus, package yields) using such substrate processes are typically on the order of about 90%. Processing the substrate before coupling the substrate to the die may, however, provide higher yield packages by allowing only good (passed) substrates to be coupled to good die. Coupling good substrates to good die using the processes depicted in FIGS. 1A-1K and/or FIGS. 2A-2K may increase package yields up to about 99% or higher.

In the process embodiments depicted in FIGS. 1A-1K and FIGS. 2A-2K, it should be understood that core material 102 may, in some embodiments, be coupled to both sides of carrier 100 (e.g., the core material is coupled to both the top and bottom of the carrier) and subsequent processing may form identical bottom packages (126 or 126') using core material on both the top and bottom of the carrier. For example, core material 102 on either side of carrier 100 may be detached from the carrier and subsequently processed individually. In addition, more than one bottom package may be formed on either side of carrier 100 from a single layer of core material 102 (e.g., core material 102 may be used as a base layer for multiple packages on either side of the carrier).

Figure 3:
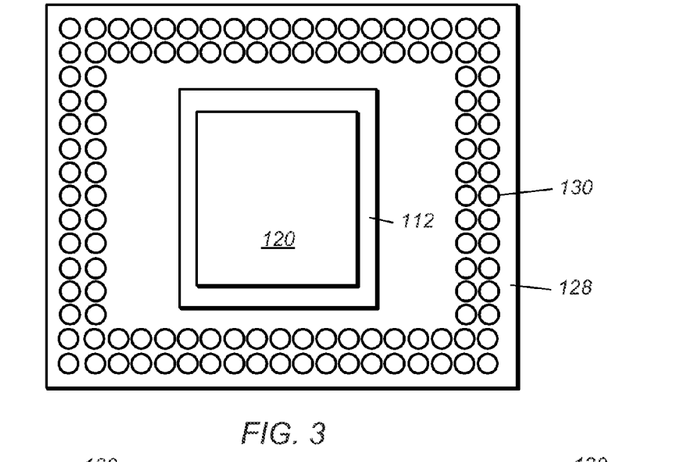
FIG. 3 depicts a top view of an embodiment of a bottom package.

FIG. 3 depicts a top view of an embodiment of bottom package 126. Bottom package 126 may be made using either of the processes depicted in FIGS. 1A-1K and/or FIGS. 2A-2K. As shown in FIG. 3, die 120 is located on substrate 112 and substantially surrounded by reinforcement layer 128 and terminals 130 in a fan-out wafer level package (FOWLP) arrangement. While the FOWLP arrangement is shown, it is to be understood that other wafer package arrangements may also be contemplated using the processes depicted in FIGS. 1A-1K and/or FIGS. 2A-2K. Terminals 130 may correspond to locations of metal layer 108 filled vias 106 (shown in FIGS. 1K and 2K).

Figure 4:
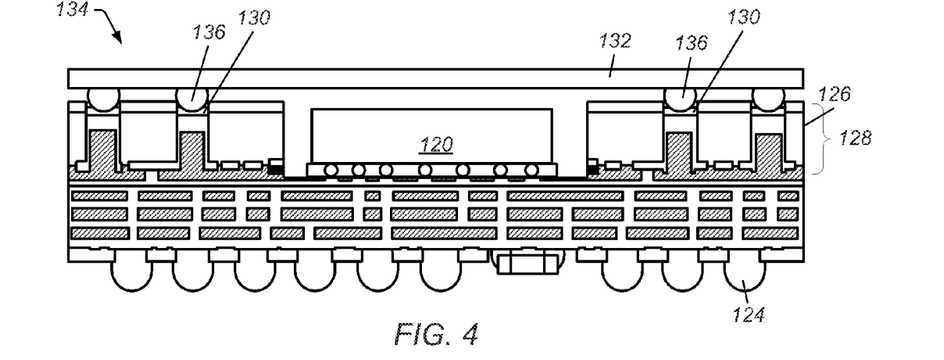
FIG. 4 depicts an embodiment of a bottom package (shown in FIG. 1K) coupled to a top package to form a PoP package.
Figure 5:
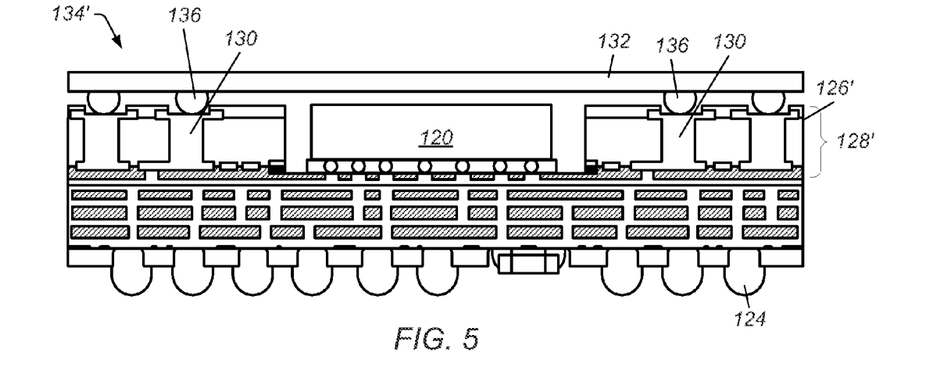
FIG. 5 depicts another embodiment of a bottom package (shown in FIG. 2K) coupled to a top package to form a PoP package.

Bottom package 126 may be coupled to a top package (e.g., a memory package) to form a PoP package. FIG. 4 depicts an embodiment of bottom package 126 (shown in FIG. 1K) coupled to top package 132 to form PoP package 134. FIG. 5 depicts an embodiment of bottom package 126' (shown in FIG. 2K) coupled to top package 132 to form PoP package 134'. Top package 132 may include, for example, a memory die or a multilayer printed circuit board (MLB). As shown in FIGS. 4 and 5, top package 132 may be coupled to reinforcement layer 128 (or 128') in bottom package 126 (or 126') by coupling terminals 136 on the top package to terminals 130 on the bottom package. Terminals 136 may be, for example, solder balls.

An MLB may use the same process methods described above for bottom package 126. Thus, other components may be located in openings similar to opening 116 in bottom package 126. For example, a fan-out wafer level package, RF module, SiP (system in package), resistor, capacitor, or an SoC may be used in the MLB. Placing the component in the respective openings may reduce the overall height after SMT (surface mount technology).

Figure 8:
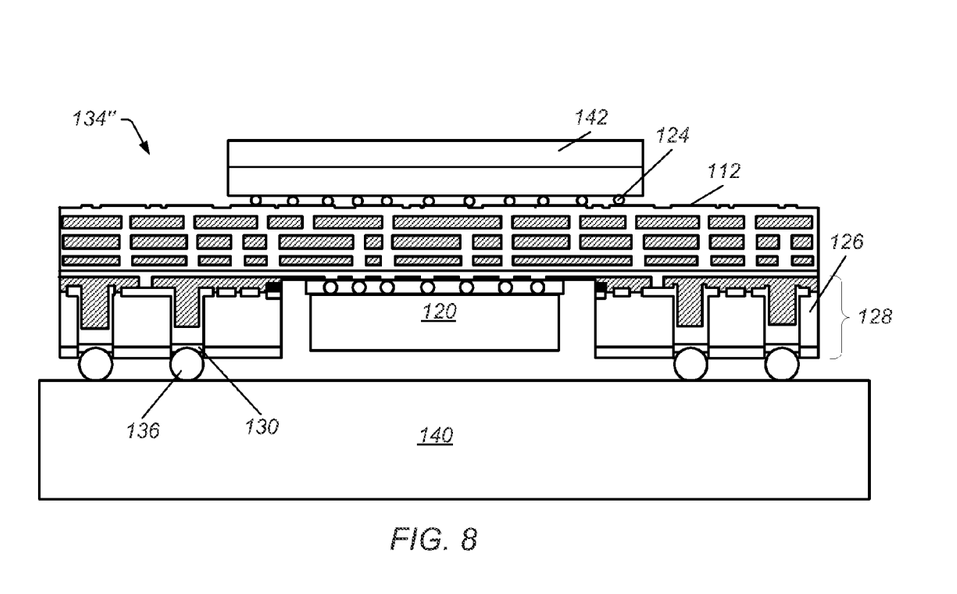
FIG. 8 depicts an embodiment of a bottom package (shown in FIG. 1K) coupled to a printed circuit board and a memory die.
Figure 9:
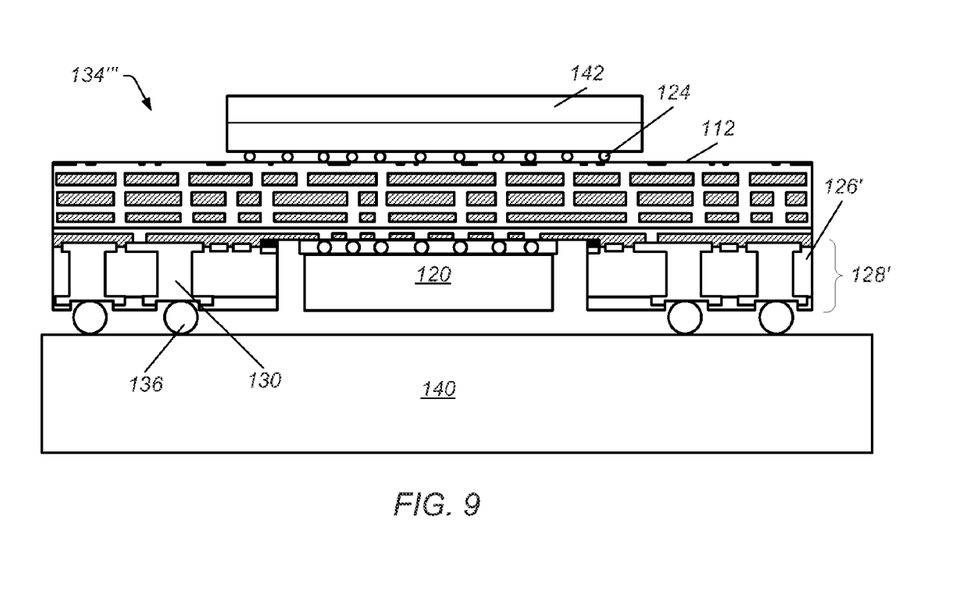
FIG. 9 depicts another embodiment of a bottom package (shown in FIG. 2K) coupled to a printed circuit board and a memory die.

In some embodiments, a bottom package as described herein (e.g., bottom package 126 or bottom package 126') is flipped over and the reinforcement layer is coupled to a printed circuit board (PCB)(e.g., the top package is a PCB but the entire assembly is flipped over so that the PCB is below the bottom package). A memory die may then be coupled to the opposite side of the bottom package from the printed circuit board. FIG. 8 depicts an embodiment of bottom package 126 (shown in FIG. 1K) coupled to printed circuit board (PCB) 140 and memory die 142. FIG. 9 depicts another embodiment of bottom package 126' (shown in FIG. 2K) coupled to PCB 140 and memory die 142. PCB 140 may be coupled to bottom package 126 (or 126') by coupling terminals 136 on the PCB to terminals 130 on the bottom package.

In certain embodiments, memory die 142 is coupled to substrate 112 on the non-PCB side (now top) of bottom package 126 (or 126') using terminals 124. Memory die 142 may be, for example, a memory die stack with two memory die stacked on top of each other. In some embodiments, memory die 142 is a fan-out memory die stack.

In certain embodiments, the pitch between terminals 130 is relatively fine, as shown in FIG. 3. The fine pitch may be possible because of the use of metal layer 108 in vias 106 to define terminals 130 on bottom package 126 or 126'. Using metal layer 108 in vias 106 to define terminals 130 provides the terminals as post-like structures that can have small spacing between the terminals. Thus, terminals 136 on top package 132, shown in FIGS. 4 and 5, may be relatively small solder balls to avoid bridging between adjacent solder balls when the top package is coupled to bottom package 126 or 126'.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A semiconductor device package assembly, comprising:
   a substrate comprising one or more layers of polymer material with one or more conductive traces in the layers of polymer material;
   a reinforcement layer at least partially covering a top surface of the substrate, the reinforcement layer being in direct contact with the substrate, wherein the reinforcement layer comprises one or more terminals coupled to the substrate and exposed at a top surface of the reinforcement layer, and wherein the reinforcement layer comprises an opening formed in the reinforcement layer subsequent to the substrate being formed on the reinforcement layer, the opening exposing at least part of the top surface of the substrate; and
   a die coupled to a terminal pad pattern on the top surface of the substrate, wherein the die is positioned in the opening in the reinforcement layer;
   wherein the terminal pad pattern on the top surface of the substrate is defined by the conductive traces in a layer of the polymer material at the top surface of the substrate, wherein the conductive traces at the top surface are exposed in the opening in the reinforcement layer when the opening in the reinforcement layer is formed.

2. The assembly of claim 1, wherein the substrate is a coreless substrate.

3. The assembly of claim 1, wherein the reinforcement layer comprises a core material, a laminate layer, and a metal layer.

4. The assembly of claim 3, wherein the laminate layer comprises build-up film or prepreg material.

5. The assembly of claim 1, wherein the terminals in the reinforcement layer comprise vias through the reinforcement layer at least partially filled with metal.

6. The assembly of claim 1, wherein a height of the reinforcement layer above the substrate is substantially similar to a height of the die above the substrate.

7. The assembly of claim 1, wherein the die comprises a system on a chip ("SoC") die.

8. A semiconductor device package assembly, comprising:
a bottom package, comprising:
   a substrate comprising one or more layers of polymer material with one or more conductive traces in the layers of polymer material;
   a reinforcement layer at least partially covering a top surface of the substrate, the substrate formed on and in direct contact with the reinforcement layer, wherein the reinforcement layer comprises one or more vias through the reinforcement layer, the vias being at least partially filled with metal and at least partially filled with polymer material from a layer of the polymer material at the top surface of the substrate, the metal in the vias being in contact with one or more of the conductive traces in the substrate and being exposed at a top surface of the reinforcement layer, and wherein the reinforcement layer comprises an opening exposing at least part of the top surface of the substrate;
   a die coupled to the top surface of the substrate, wherein the die is positioned in the opening in the reinforcement layer; and
a top package;
wherein the top package is coupled to one or more of the terminals in the reinforcement layer.

9. The assembly of claim 8, wherein the substrate comprises a coreless substrate.

10. The assembly of claim 8, wherein the top package comprises a memory die.

11. The assembly of claim 8, wherein the top package comprises a printed circuit board, and wherein the assembly further comprises a memory die coupled to a bottom surface of the substrate.

12. The assembly of claim 8, wherein the reinforcement layer comprises a core material, a laminate layer, and a metal layer.

13. The assembly of claim 3, wherein the opening in the reinforcement layer has been formed by removing the core material, the laminate layer, and the metal layer in the opening down to the top surface of the substrate to expose conductive traces in the layer of polymer material at the top surface of the substrate, the exposed conductive traces defining the terminal pad pattern.

14. The assembly of claim 5, wherein the metal in the vias is in contact with one or more of the conductive traces in the substrate subsequent to forming the substrate on the reinforcement layer.

15. The assembly of claim 8, wherein substrate is formed on and in direct contact with the reinforcement layer such that the substrate is in direct contact with the reinforcement layer without an intervening material.

16. The assembly of claim 8, wherein the opening in the reinforcement layer exposes conductive traces at the top surface of the substrate, the exposed conductive traces defining a terminal pad pattern for coupling the die to the substrate.

17. A semiconductor device package assembly, comprising:
   a reinforcement layer, wherein the reinforcement layer comprises one or more terminals exposed at a top surface of the reinforcement layer;
   a substrate formed on a lower surface of the reinforcement layer, the substrate being in direct contact with the reinforcement layer, the substrate comprising one or more layers of polymer material with one or more conductive traces in the layers of polymer material, wherein at least one of the conductive traces in the substrate is coupled to at least one of the terminals at the lower surface of the reinforcement layer; an opening formed through the reinforcement layer with the substrate formed on the reinforcement layer, wherein the opening is formed by removing portions of the reinforcement layer in the opening to expose at least part of a surface of the substrate including at least some of the conductive traces in a layer of polymer material at the surface of the substrate; and
   a die positioned in the opening in the reinforcement layer and coupled to at least some of the conductive traces in the exposed part of the surface of the substrate.

18. The assembly of claim 17, wherein the opening in the reinforcement layer is formed by removing material from the reinforcement layer down to the surface of the substrate.

19. The assembly of claim 17, wherein the die is coupled to a terminal pad pattern on the surface of the substrate, the terminal pad pattern being defined by the conductive traces exposed at the surface of the substrate when the opening in the reinforcement layer is formed.

20. The assembly of claim 17, wherein the terminals in the reinforcement layer comprise vias through the reinforcement layer at least partially filled with metal, the metal in the vias being in contact with one or more of the conductive traces in the substrate subsequent to forming the substrate on the reinforcement layer.

* * * * *